US012787518B2

(12) United States Patent
Tseng et al.

(10) Patent No.: US 12,787,518 B2
(45) Date of Patent: Nov. 3, 2026

(54) LIGHT-EMITTING DEVICE STRUCTURE AND DISPLAY APPARATUS

(71) Applicant: PlayNitride Display Co., Ltd., MiaoLi County (TW)

(72) Inventors: Yu-Jui Tseng, MiaoLi County (TW); Chih-Ling Wu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 370 days.

(21) Appl. No.: 18/391,652

(22) Filed: Dec. 21, 2023

(65) Prior Publication Data

US 2025/0212570 A1 Jun. 26, 2025

(51) Int. Cl.

*H10H 20/856* (2025.01)
*H10H 20/851* (2025.01)
*H10H 29/14* (2025.01)

(52) U.S. Cl.

CPC ...... *H10H 20/856* (2025.01); *H10H 20/8514* (2025.01); *H10H 29/142* (2025.01)

(58) Field of Classification Search

CPC ............. H10H 20/856; H10H 20/8514; H10H 29/142; H10H 20/841; H10W 90/00
See application file for complete search history.

(56) References Cited

U.S. PATENT DOCUMENTS

2015/0282260 A1* 10/2015 Hussell .................. H05B 45/00 438/23
2023/0007967 A1* 1/2023 Liu ...................... H10H 29/142

FOREIGN PATENT DOCUMENTS

EP 4060754 8/2023
TW 202329487 7/2023
TW 202347819 12/2023

OTHER PUBLICATIONS

"Office Action of Taiwan Counterpart Application", issued on Nov. 18, 2024, p. 1-p. 12.

* cited by examiner

*Primary Examiner* — Mekonnen D Dagnew
(74) *Attorney, Agent, or Firm* — JCIPRNET

(57) ABSTRACT

A light-emitting device structure includes at least one light-emitting device and a reflective retaining wall. Each light-emitting device includes a first-type semiconductor layer, a light-emitting layer, and a second-type semiconductor layer. The light-emitting layer is located between the first-type semiconductor layer and the second-type semiconductor layer, and the second-type semiconductor layer has a light-emitting surface. The reflective retaining wall includes a first portion and a second portion. The first portion surrounds a side wall of the second-type semiconductor layer of each light-emitting device and exposes the light-emitting surface of each light-emitting device. The second portion is disposed on a surface of the first portion, and a connection portion between the second portion and the first portion is separated from the light-emitting surface by a distance.

15 Claims, 9 Drawing Sheets

LIGHT-EMITTING DEVICE STRUCTURE AND DISPLAY APPARATUS

BACKGROUND

Technical Field

The disclosure relates to a light-emitting display technology, and in particular to a light-emitting device structure and a display apparatus.

Description of Related Art

During the production process of a micro light-emitting diode, a high-reflectivity metal groove must be used to increase the light extraction efficiency. However, due to the requirement for high precision and the limitation of coating technology, structural deviation and an excessively wide bottom of the metal groove may easily cause the metal groove to block a light-emitting surface of the micro light-emitting diode, thereby causing light shielding, which reduces the light extraction efficiency of the micro light-emitting diode.

SUMMARY

The disclosure provides a light-emitting device structure, which can reduce light shielding of a metal groove in the prior art and improve optical properties.

The disclosure also provides a display apparatus, which includes the light-emitting device structure and has preferable display quality.

The light-emitting device structure of the disclosure includes at least one light-emitting device and a reflective retaining wall. Each light-emitting device includes a first-type semiconductor layer, a light-emitting layer, and a second-type semiconductor layer. The light-emitting layer is located between the first-type semiconductor layer and the second-type semiconductor layer, and the second-type semiconductor layer has a light-emitting surface. The reflective retaining wall includes a first portion and a second portion. The first portion surrounds a side wall of the second-type semiconductor layer of each light-emitting device and exposes the light-emitting surface of each light-emitting device. The second portion is disposed on a surface of the first portion, and a connection portion between the second portion and the first portion is separated from the light-emitting surface by a distance.

The display apparatus of the disclosure includes a substrate and multiple light-emitting device structures. The light-emitting device structure is disposed on the substrate, and each light-emitting device structure includes at least one light-emitting device and a reflective retaining wall. Each light-emitting device includes a first-type semiconductor layer, a light-emitting layer, and a second-type semiconductor layer. The light-emitting layer is located between the first-type semiconductor layer and the second-type semiconductor layer, and the second-type semiconductor layer has a light-emitting surface. The reflective retaining wall includes a first portion and a second portion. The first portion surrounds a side wall of the second-type semiconductor layer of each light-emitting device and exposes the light-emitting surface of each light-emitting device. The second portion is disposed on a surface of the first portion, and a connection portion between the second portion and the first portion is separated from the light-emitting surface by a distance.

Based on the above, in the design of the light-emitting device structure of the disclosure, the first portion of the reflective retaining wall surrounds the side wall of the second-type semiconductor layer of each light-emitting device and exposes the light-emitting surface of each light-emitting device, the second portion of the reflective retaining wall is disposed on the surface of the first portion, and the connection portion between the second portion and the first portion is separated from the light-emitting surface by the distance. In this way, the configuration of the reflective retaining wall does not block the light-emitting surface of the light-emitting device, which can reduce the light shielding of the metal groove in the prior art and effectively improve the light extraction efficiency of the light-emitting device structure of the disclosure. In addition, the display apparatus adopting the light-emitting device structure of the disclosure can have preferable display quality.

In order for the features and advantages of the disclosure to be more comprehensible, the following specific embodiments are described in detail in conjunction with the drawings.

DESCRIPTION OF THE EMBODIMENTS

The embodiments of the disclosure MAY be understood together with the drawings, and the drawings of the disclosure are also regarded as a PART of the description of the disclosure. It is to be understood that the drawings of the disclosure are not drawn to scale and, in fact, dimensions of devices may be arbitrarily enlarged or reduced in order to clearly illustrate the features of the disclosure.

Figure 1:
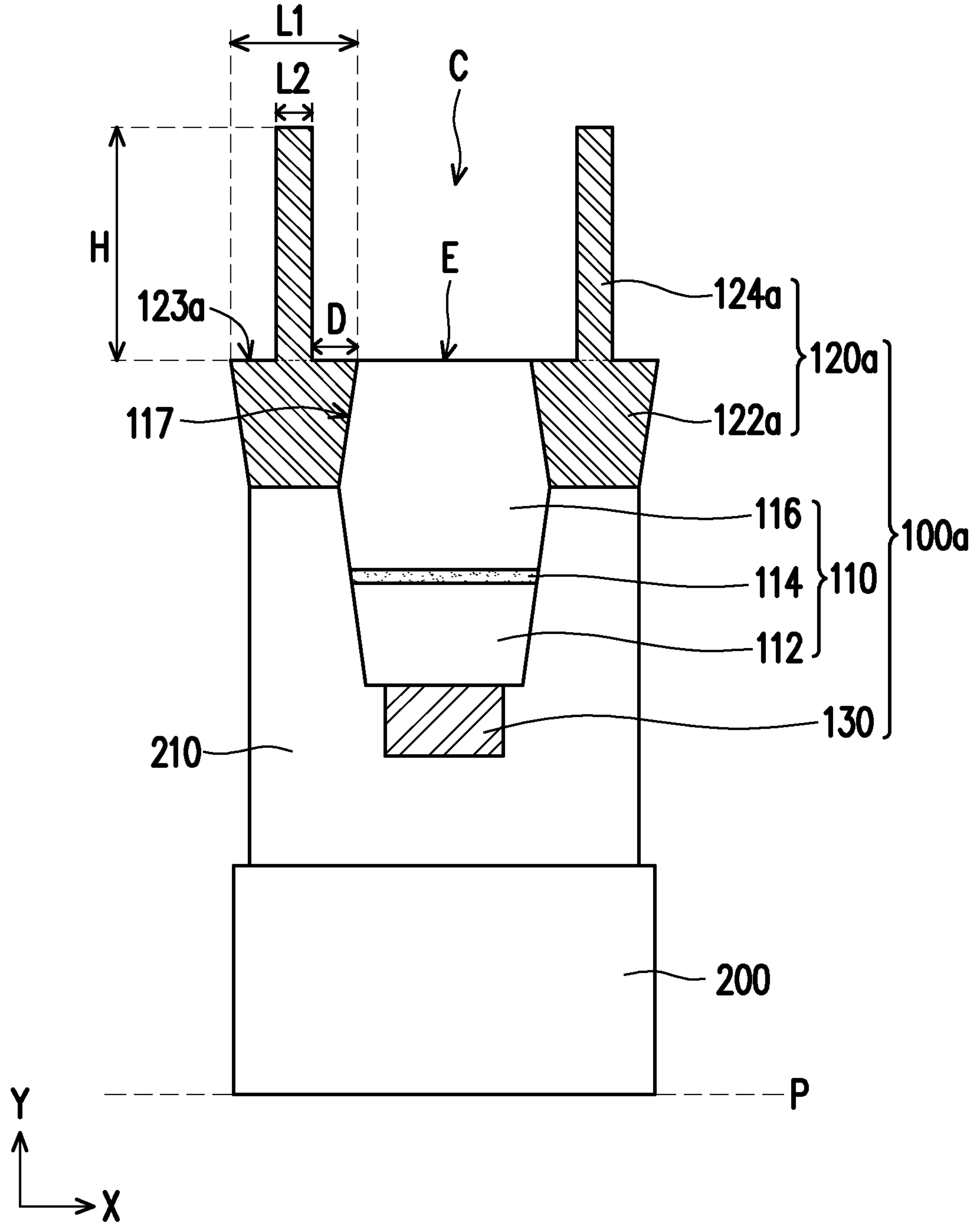
FIG. 1 is a schematic cross-sectional view of a light-emitting device structure according to an embodiment of the disclosure.

FIG. 1 is a schematic cross-sectional view of a light-emitting device structure according to an embodiment of the disclosure. Please refer to FIG. 1. In the embodiment, a light-emitting device structure 100*a* includes at least one light-emitting device (one light-emitting device 110 is schematically shown) and a reflective retaining wall 120*a*. The light-emitting device 110 includes a first-type semiconductor layer 112, a light-emitting layer 114, and a second-type semiconductor layer 116. The light-emitting layer 114 is located between the first-type semiconductor layer 112 and the second-type semiconductor layer 116, and the second-type semiconductor layer 116 has a light-emitting surface E. The reflective retaining wall 120*a* includes a first portion 122*a* and a second portion 124*a*. The first portion 122*a* surrounds a side wall 117 of the second-type semiconductor layer 116 of each light-emitting device 110 and exposes the light-emitting surface E of each light-emitting device 110. The second portion 124*a* is disposed on a surface 123*a* of the first portion 122*a*, and a connection portion between the second portion 124*a* and the first portion 122*a* is separated from the light-emitting surface E by a distance D.

Specifically, in the embodiment, the light-emitting device structure 100*a* is disposed on a substrate 200, and an insulating layer 210 is disposed between the light-emitting device structure 100*a* and the substrate 200, wherein the substrate 200 is, for example, a transparent rigid substrate, such as a glass substrate or a sapphire substrate, but is not limited thereto. In an embodiment, the light-emitting device structure 100*a* may be, for example, a micro light-emitting diode (micro LED) or a microchip. As used herein, a “micro” device means that the device has dimensions from 1 micron to 100 microns. In some embodiments, the light-emitting device structure may have a maximum width of one of 20 microns, 10 microns, or 5 microns. In some embodiments, the light-emitting device structure may have a maximum height of less than 20 microns, 10 microns, or 5 microns. However, it should be understood that the embodiment is not necessarily limited thereto, and aspects of certain embodiments may be applied to greater and perhaps smaller scales.

One of the first-type semiconductor layer 112 and the second-type semiconductor layer 116 of the light-emitting device 110 of the embodiment is a P-type semiconductor layer, and the other one of the first-type semiconductor layer 112 and the second-type semiconductor layer 116 is an N-type semiconductor layer. In other words, in an embodiment, the first-type semiconductor layer 112 may be a P-type semiconductor layer, and the second-type semiconductor layer 116 may be an N-type semiconductor layer. In another embodiment, the first-type semiconductor layer 112 may be an N-type semiconductor layer, and the second-type semiconductor layer 116 may be a P-type semiconductor layer. The light-emitting layer 114 is, for example, a multiple quantum well (MQW) structural layer, but not limited thereto.

Furthermore, the first portion 122*a* of the reflective retaining wall 120*a* of the embodiment directly contacts and covers a part of the side wall 117 of the second-type semiconductor layer 116 and completely exposes the light-emitting surface E of the light-emitting device 110. Here, the surface 123*a* of the first portion 122*a* of the reflective retaining wall 120*a* may be flush with the light-emitting surface E of the light-emitting device 110. In an embodiment, the cross-sectional shape of the first portion 122*a* of the reflective retaining wall 120*a* may be, for example, an inverted trapezoid that is wider at the top and narrower at the bottom, but not limited thereto. The second portion 124*a* is directly disposed on the surface 123*a* of the first portion 122*a*, wherein the second portion 124*a* directly contacts the surface 123*a* of the first portion 122*a*. In an embodiment, an extension direction (for example, a Y-axis direction) of the second portion 124*a* may be perpendicular to an extension direction (for example, an X-axis direction) of the first portion 122*a*, but not limited thereto. In an embodiment, the second portion 124*a* may be a continuous ring structure, that is, there are front, rear, left, and right side walls. In an embodiment, the second portion 124*a* may be a discontinuous side wall structure on the left and right sides.

In particular, the connection portion between the second portion 124*a* and the first portion 122*a* is separated from the light-emitting surface E by the distance D, which means that the configuration of the second portion 124*a* does not block the light-emitting surface E of the light-emitting device 110. In an embodiment, the distance D is, for example, 0.01 micron to 1 micron. As shown in FIG. 1, the second portion 124*a* and the surface 123*a* of the first portion 122*a* of the reflective retaining wall 120*a* and the light-emitting surface E may define an accommodating space C, wherein a first orthographic projection area of the accommodating space C on a horizontal plane P is greater than a second orthographic projection area of the light-emitting surface E on the horizontal plane P. In other words, the surface 123*a* of the first portion 122*a* and the light-emitting surface E may be regarded as a bottom surface of the accommodating space C, the second portion 124*a* may be regarded as a side wall of the accommodating space C, and the area of the accommodating space C is greater than the area of the light-emitting surface E. In this way, the configuration of the reflective retaining wall 120*a* does not block the light-emitting surface E of the light-emitting device 110 at all, so that the light-emitting device structure 100*a* has a light-emitting aperture ratio of 100%.

Furthermore, the material of the reflective retaining wall 120*a* of the embodiment may be, for example, a metal material, such as copper, aluminum, or other appropriate metal materials, or a non-metal material. In an embodiment, the first portion 122*a* and the second portion 124*a* of the reflective retaining wall 120*a* may be an integrally formed structure, which means that the first portion 122*a* and the second portion 124*a* are made of the same material. In an embodiment, the first portion 122*a* and the second portion 124*a* of the reflective retaining wall 120*a* may also be made of different materials. When the material of the reflective retaining wall 120*a* is a metal material, the first portion 122*a* of the reflective retaining wall 120*a* may be electrically connected to the second-type semiconductor layer 116. When the second-type semiconductor layer 116 is an N-type semiconductor layer, the first portion 122*a* is electrically connected to the second-type semiconductor layer 116 to form an ohmic contact to conduct current. On the other hand, the first portion 122*a* of the reflective retaining wall 120*a* is electrically isolated from the light-emitting layer 114 and the first-type semiconductor layer 112. In other words, the first portion 122*a* does not contact and is electrically insulated from the light-emitting layer 114 and the first-type semiconductor layer 112.

Please refer to FIG. 1 again. In the embodiment, the first portion 122*a* of the reflective retaining wall 120*a* has a first maximum width L1, the second portion 124*a* has a second maximum width L2, and the second maximum width L2 is less than the first maximum width L1. In an embodiment, the first maximum width L1 is, for example, between 1.2 microns and 1.7 microns, that is, $1.2\ \text{microns} < L1 < 1.7\ \text{microns}$. In an embodiment, the second maximum width L2 is, for example, between 0.7 microns and 1.2 microns, that is, $0.7\ \text{microns} < L2 < 1.2\ \text{microns}$. Furthermore, the second portion 124*a* has a height H, wherein the ratio of the height H to the first maximum width L1 is, for example, between 1 and 4, that is, $1 < H/L1 < 4$. In other words, the second portion 124*a* on the light-emitting surface E may be elongated and smaller and thinner in width than the first portion 122*a*, which can increase the volume of the accommodating space C. In an embodiment, the height (or the thickness) of the first portion 122*a* may be less than the height H of the second portion 124*a*.

In addition, the light-emitting device structure 100*a* of the embodiment further includes an electrode 130 disposed on the first-type semiconductor layer 112 of the light-emitting device 110, wherein the electrode 130 is electrically connected to the first-type semiconductor layer 112. When the reflective retaining wall 120*a* is made of a metal material, the light-emitting device structure 100*a* of the embodiment may be regarded as a vertical light-emitting device structure, such as a vertical micro light-emitting diode.

The first portion 122*a* of the reflective retaining wall 120*a* of the embodiment surrounds the side wall 117 of the second-type semiconductor layer 116 and exposes the light-emitting surface E of the light-emitting device 110, the second portion 124*a* of the reflective retaining wall 120*a* is disposed on the surface 123*a* of the first portion 122*a*, and the connection portion between the second portion 124*a* and the first portion 122*a* is separated from the light-emitting surface E by the distance D. In this way, the configuration of the reflective retaining wall 120*a* does not block the light-emitting surface E of the light-emitting device 110, which can reduce light shielding of a metal groove in the prior art and effectively improve the light extraction efficiency of the light-emitting device structure 100*a* of the embodiment.

It must be noted here that the following embodiments continue to use the reference numerals and some content of the foregoing embodiment, wherein the same reference numerals are adopted to represent the same or similar devices, and the description of the same technical contents is omitted. For the description of the omitted part, reference may be made to the foregoing embodiment, which will not be repeated in the following embodiments.

Figure 2:
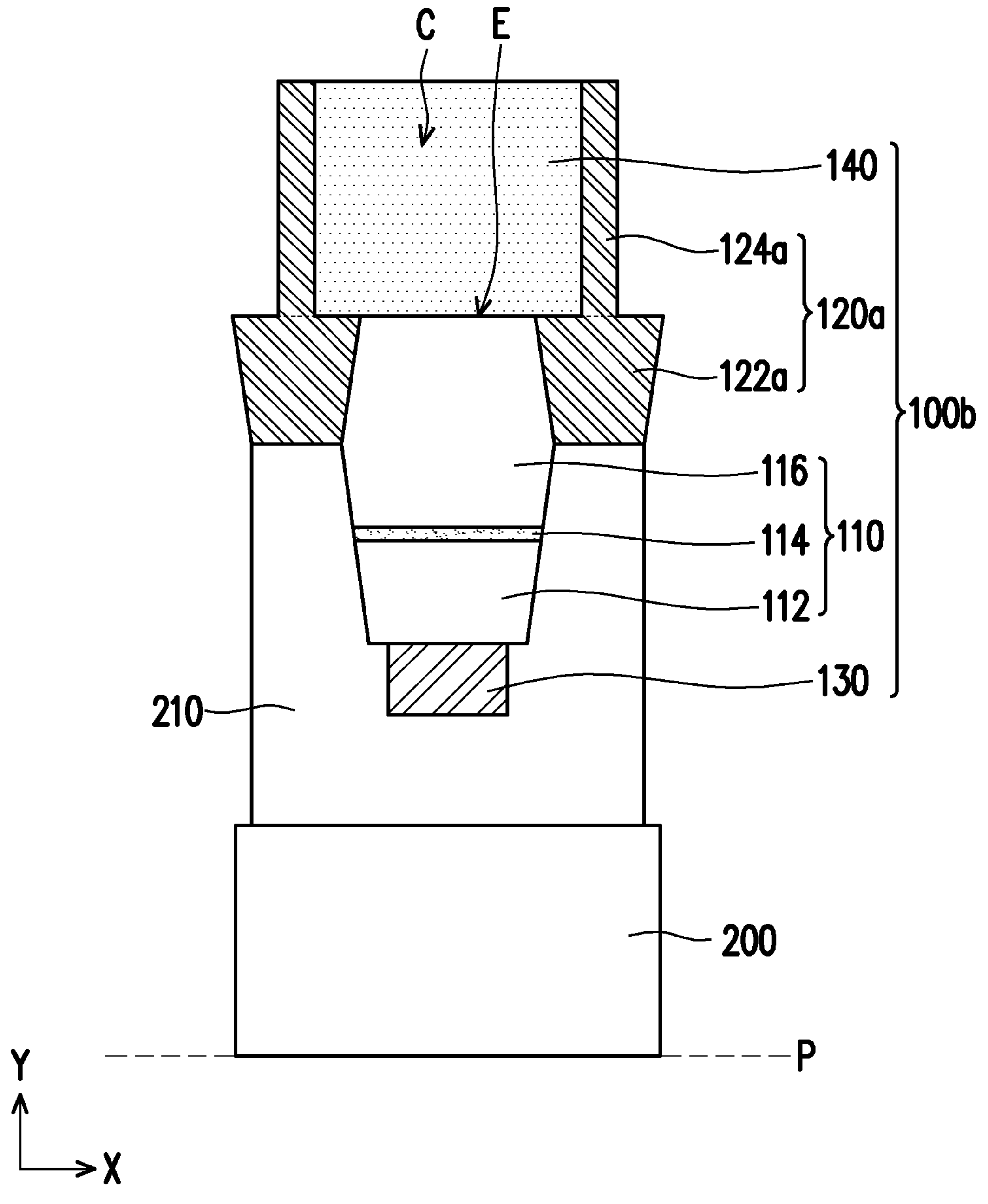
FIG. 2 is a schematic cross-sectional view of a light-emitting device structure according to another embodiment of the disclosure.

FIG. 2 is a schematic cross-sectional view of a light-emitting device structure according to another embodiment of the disclosure. Please refer to FIG. 1 and FIG. 2 at the same time. A light-emitting device structure 100*b* of the embodiment is similar to the light-emitting device structure 100*a*. The difference between the two is that in the embodiment, the light-emitting device structure 100*b* further includes a color conversion material 140 disposed in the accommodating space C to provide color conversion of light emitted by the light-emitting device structure 100*b*. In an embodiment, the color conversion material 140 is, for example, a fluorescent material, quantum dot (QD), or a wavelength conversion material with similar properties. Since the configuration of the reflective retaining wall 120*a* does not block the light-emitting surface E of the light-emitting device 110, it means that a greater accommodating space C may be provided compared to the prior art. Therefore, the filling amount of the color conversion material 140 is increased, thereby improving the color conversion efficiency of the light-emitting device structure 100*b*, and the light emitted from the light-emitting surface E may directly enter the color conversion material 140 without being shielded by the reflective retaining wall 120*a*, so that the overall light-emitting efficiency of the light-emitting device structure 100*b* is improved. In some embodiments, the first orthographic projection area is, for example, less than 1.6 times the second orthographic projection area. If the accommodating space C is too large, the color conversion material 140 located near an outer region at the bottom of the accommodating space C cannot be irradiated by the light emitted by the light-emitting surface E, causing the effect of color conversion to be poor.

Figure 3:
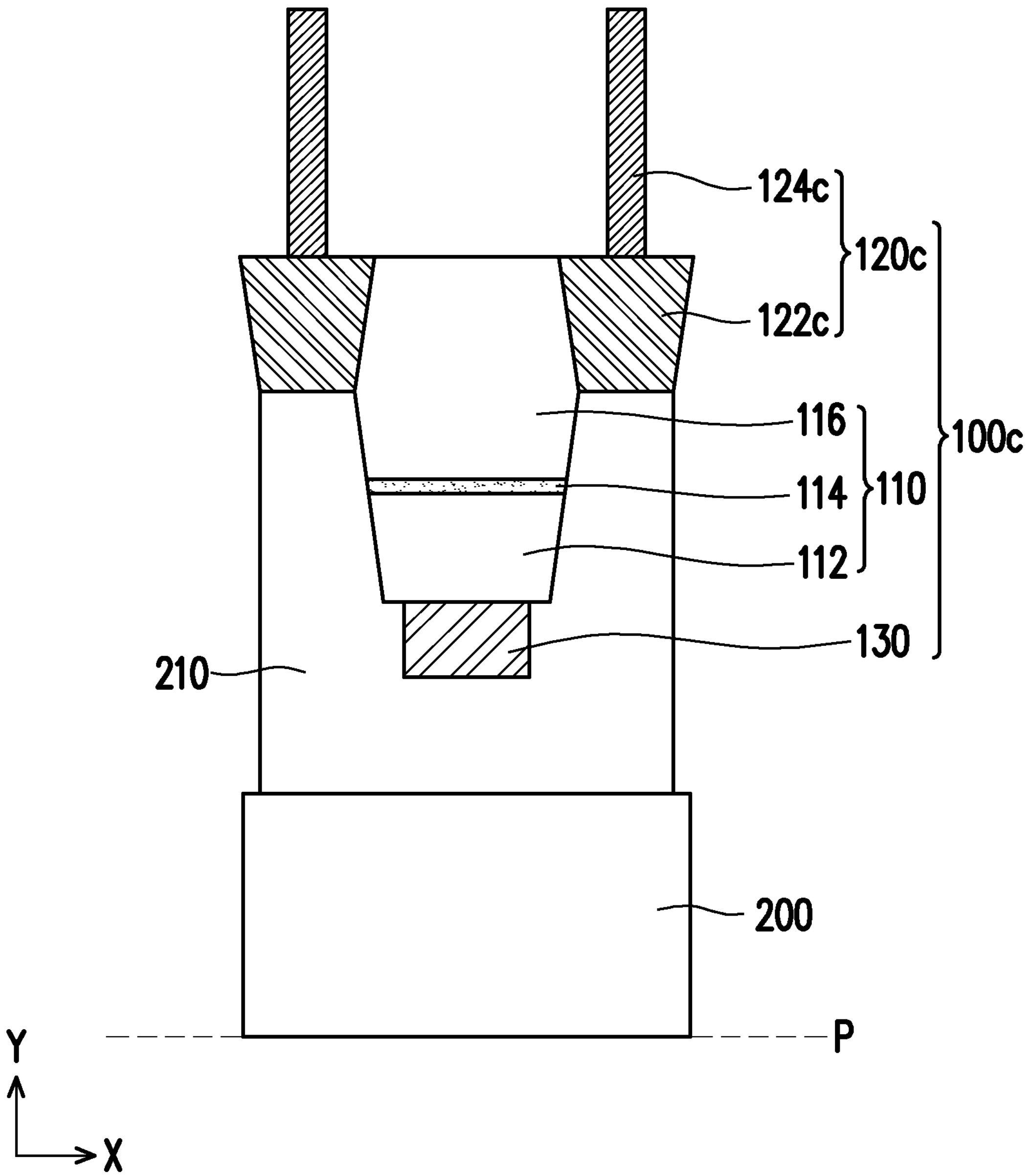
FIG. 3 is a schematic cross-sectional view of a light-emitting device structure according to another embodiment of the disclosure.

FIG. 3 is a schematic cross-sectional view of a light-emitting device structure according to another embodiment of the disclosure. Please refer to FIG. 1 and FIG. 3 at the same time. A light-emitting device structure 100*c* of the embodiment is similar to the light-emitting device structure 100*a*. The difference between the two is that in the embodiment, the material of a first portion 122*c* and the material of a second portion 124*c* of the reflective retaining wall 120*c* are different metal materials. In an embodiment, for the purpose of conduction, impedance of a conductive line is reduced, and the conductivity of the first portion 122*c* may be greater than the conductivity of the second portion 124*c*. In an embodiment, for the purpose of reflection, the ratio of light interacting back and forth with the color conversion material 140 in the accommodating space C is increased, and the reflectivity of the second portion 124*c* is greater than the reflectivity of the first portion 122*c*. In an embodiment, the material of the first portion 122*c* of the reflective retaining wall 120*c* may be, for example, copper, and the material of the second portion 124*c* of the reflective retaining wall 120*c* may be, for example, aluminum.

Figure 4:
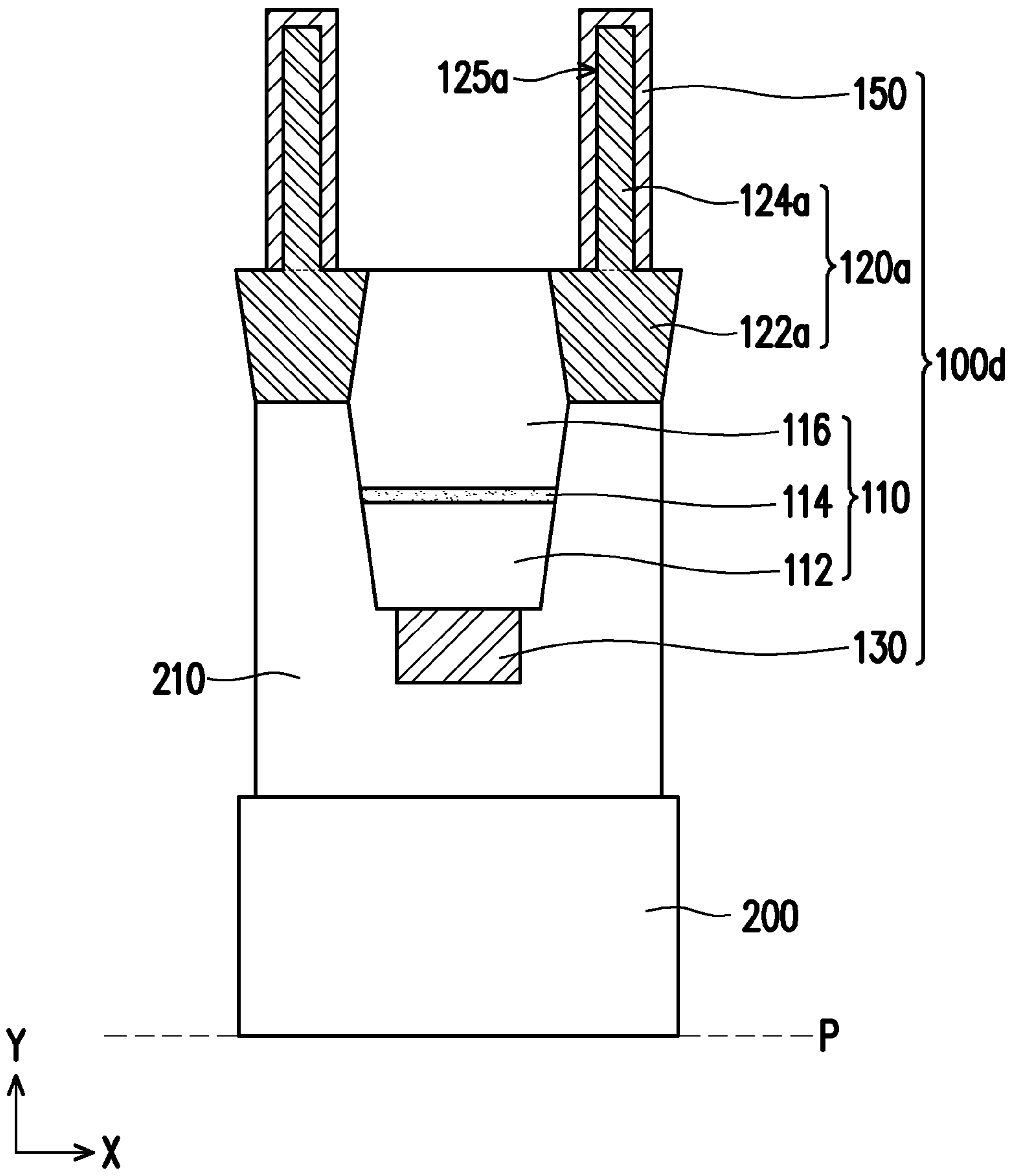
FIG. 4 is a schematic cross-sectional view of a light-emitting device structure according to another embodiment of the disclosure.

FIG. 4 is a schematic cross-sectional view of a light-emitting device structure according to another embodiment of the disclosure. Please refer to FIG. 1 and FIG. 4 at the same time. A light-emitting device structure 100*d* of the embodiment is similar to the light-emitting device structure 100*a*. The difference between the two is that in the embodiment, the material of the reflective retaining wall 120*a* is a metal material, and the light-emitting device structure 100*d* further includes a reflective layer 150 covering a surrounding surface 125*a* of the second portion 124*a*, wherein the reflectivity of the reflective layer 150 is greater than the reflectivity of the reflective retaining wall 120*a*, which means that the material of the reflective layer 150 is different from the material of the reflective retaining wall 120*a*. In detail, the first portion 122*a* and the second portion 124*a* of the reflective retaining wall 120*a* of the embodiment are embodied as an integrally formed structure, that is, the first portion 122*a* and the second portion 124*a* are made of the same metal material, which can increase the material volume of conductive portions to improve the overall conductive performance. The reflective layer 150 directly covers the surrounding surface 125*a* of the second portion 124*a* and is conformally configured. In an embodiment, the material of the reflective retaining wall 120*a* is, for example, copper, and the material of the reflective layer 150 is, for example, silver, but not limited thereto.

Figure 5:
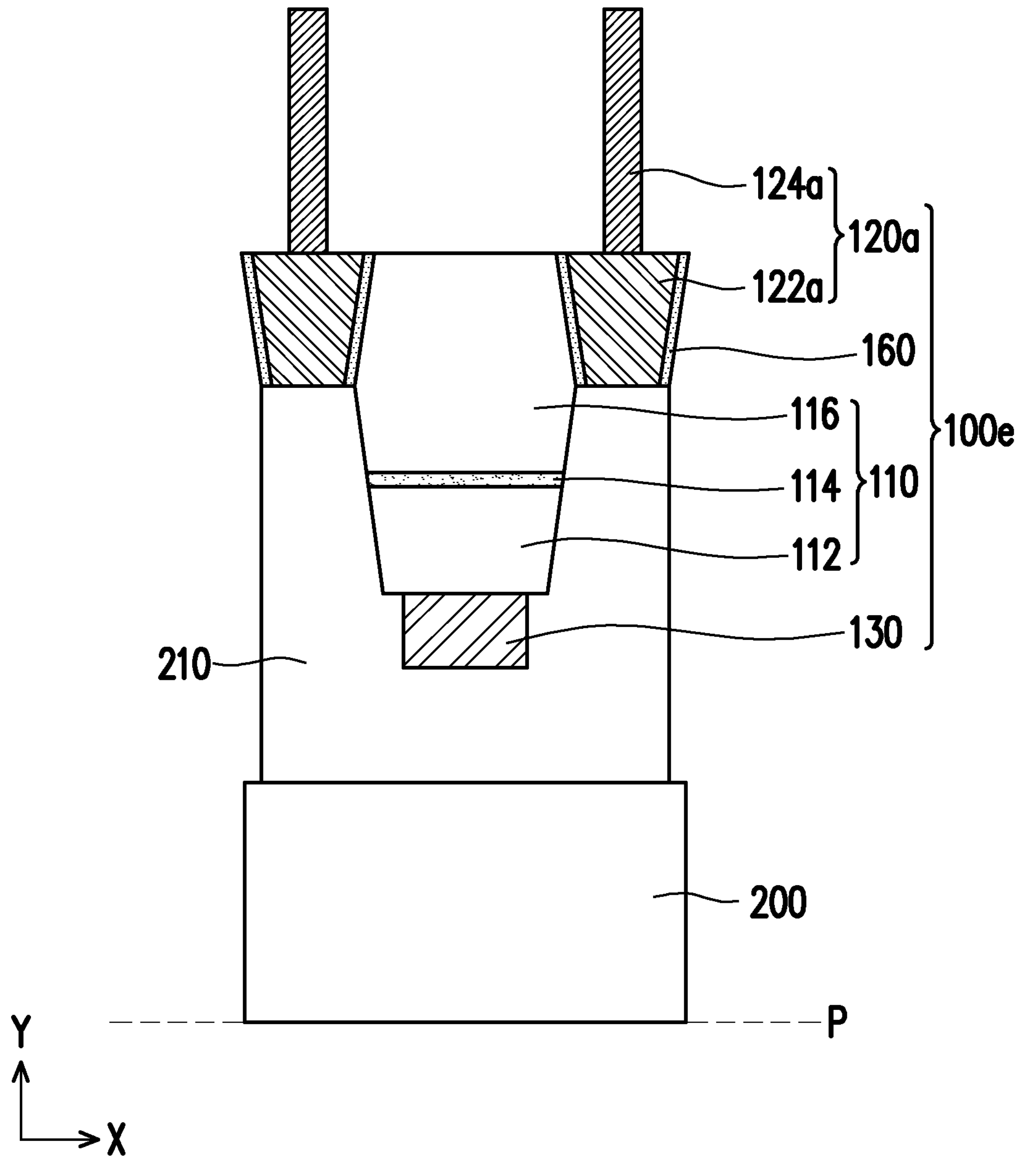
FIG. 5 is a schematic cross-sectional view of a light-emitting device structure according to another embodiment of the disclosure.

FIG. 5 is a schematic cross-sectional view of a light-emitting device structure according to another embodiment of the disclosure. Please refer to FIG. 1 and FIG. 5 at the same time. A light-emitting device structure 100*e* of the embodiment is similar to the light-emitting device structure 100*a*. The difference between the two is that in the embodiment, the light-emitting device structure 100*e* further includes an ohmic contact layer 160 disposed between the first portion 122*a* of the reflective retaining wall 120*a* and the second-type semiconductor layer 116. In an embodiment, the material of the ohmic contact layer 160 may be, for example, $MoSi_2$, PtSi, $CoSi_2$, $WSi_2$, AuSb, In, Mo, indium tin oxide (ITO), or titanium/platinum/gold, which can effectively reduce impedance.

Figure 6:
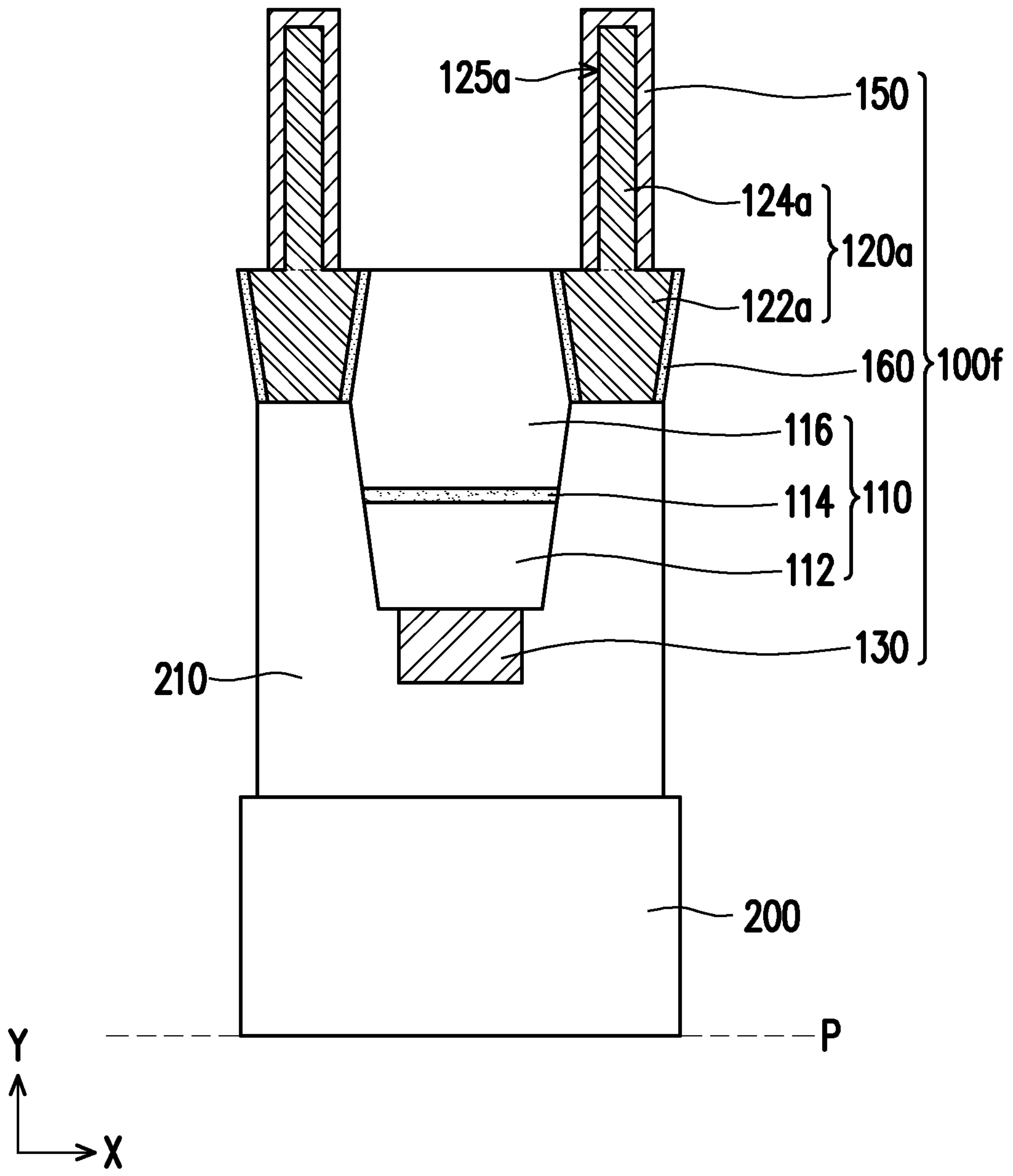
FIG. 6 is a schematic cross-sectional view of a light-emitting device structure according to another embodiment of the disclosure.

FIG. 6 is a schematic cross-sectional view of a light-emitting device structure according to another embodiment of the disclosure. Please refer to FIG. 1 and FIG. 6 at the same time. A light-emitting device structure 100*f* of the embodiment is similar to the light-emitting device structure 100*a*. The difference between the two is that in the embodiment, the material of the reflective retaining wall 120*a* is a metal material, and the light-emitting device structure 100*f* further includes a reflective layer 150 and an ohmic contact layer 160. The reflective layer 150 covers a surrounding surface 125*a* of the second portion 124*a*, wherein the reflectivity of the reflective layer 150 is greater than the reflectivity of the reflective retaining wall 120*a*, which means that the material of the reflective layer 150 is different from the material of the reflective retaining wall 120*a*. In detail, the first portion 122*a* and the second portion 124*a* of the reflective retaining wall 120*a* of the embodiment are embodied as an integrally formed structure, that is, the first portion 122*a* and the second portion 124*a* are made of the same metal material, which can increase the material volume of conductive portions to improve the overall conductive performance. The reflective layer 150 directly covers the surrounding surface 125*a* of the second portion 124*a* and is conformally configured. In an embodiment, the material of the reflective retaining wall 120*a* is, for example, copper, and the material of the reflective layer 150 is, for example, silver, but not limited thereto.

In addition, the ohmic contact layer 160 is disposed between the first portion 122*a* of the reflective retaining wall 120*a* and the second-type semiconductor layer 116. In an embodiment, the material of the ohmic contact layer 160 may be, for example, $MoSi_2$, PtSi, $CoSi_2$, $WSi_2$, AuSb, In, Mo, indium tin oxide (ITO), or titanium/platinum/gold, which can effectively reduce impedance.

Figure 7A:
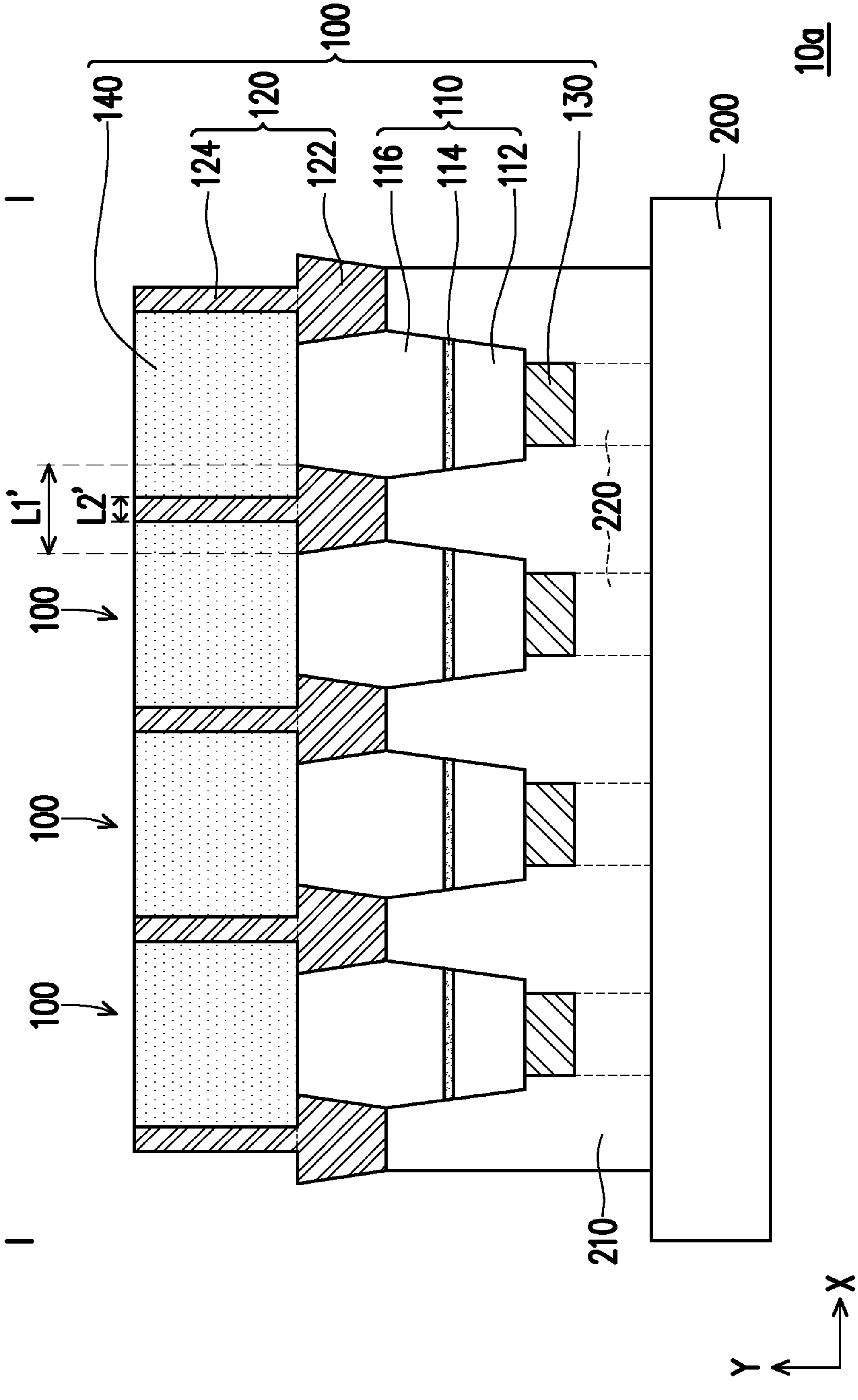
FIG. 7A is a schematic cross-sectional view of a display apparatus according to an embodiment of the disclosure.
Figure 7B:
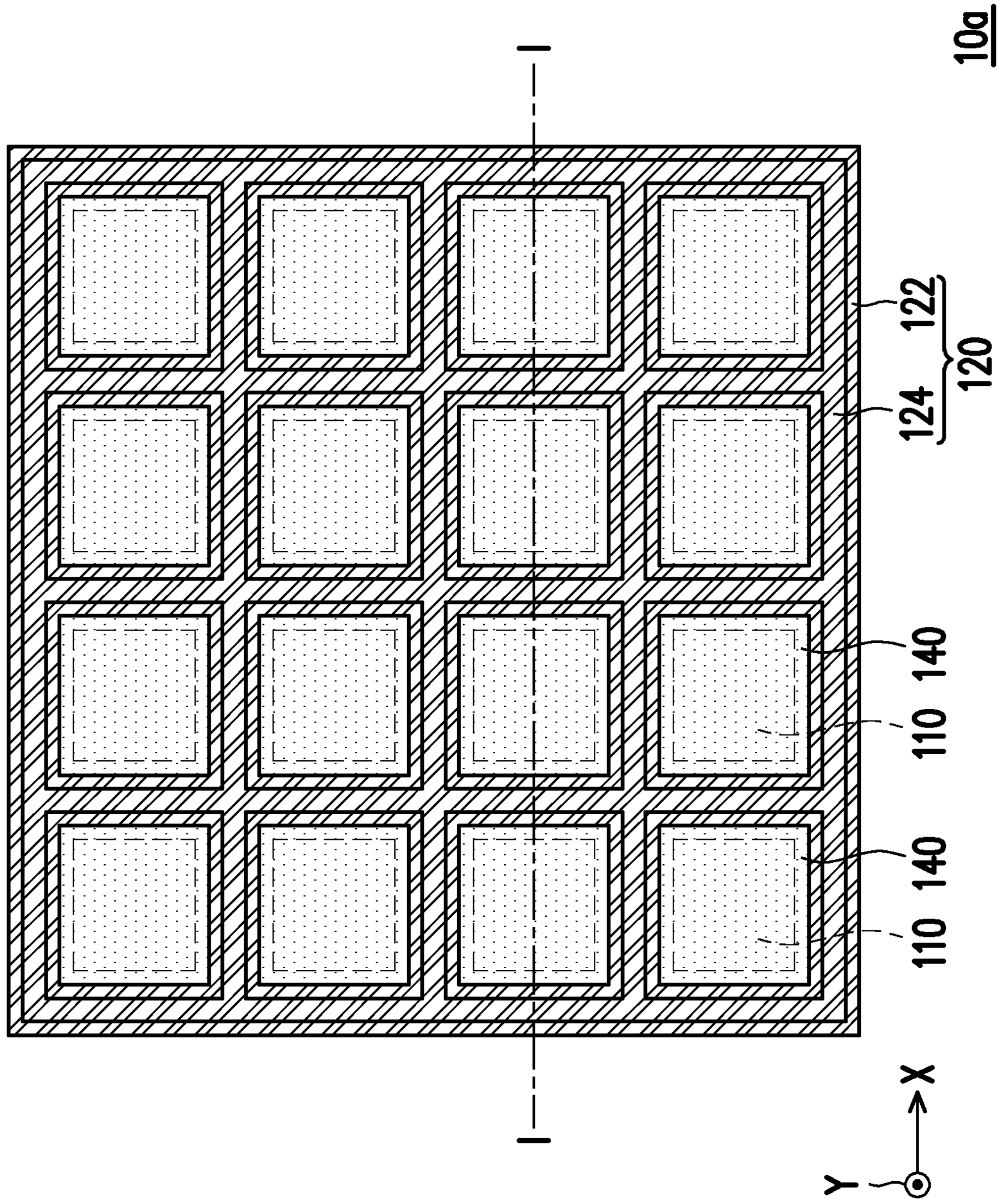
FIG. 7B is a schematic top view of the display apparatus of FIG. 7A.

FIG. 7A is a schematic cross-sectional view of a display apparatus according to an embodiment of the disclosure. FIG. 7B is a schematic top view of the display apparatus of FIG. 7A. Please refer to FIG. 7A and FIG. 7B at the same time. In the embodiment, a display apparatus 10*a* includes a substrate 200 and multiple light-emitting device structures 100, wherein the light-emitting device structure 100 is disposed on the substrate 200, and the electrode 130 of the light-emitting device structure 100 is electrically connected to the substrate 200 through a metal wiring 220.

In detail, the light-emitting device structure 100 of the embodiment is similar to the light-emitting device structure 100*b* of FIG. 2. The difference between the two is that the material of a reflective retaining wall 120 of the embodiment is metal, and the two adjacent light-emitting device structures 100 share the same reflective retaining wall 120. In other words, first portions 122 of the two adjacent reflective retaining walls 120 are connected together to form a continuous structural layer, and second portions 124 of the two adjacent reflective retaining walls 120 are connected together to form a continuous structural layer. Furthermore, the first portion 122 between the two adjacent light-emitting devices 110 has a first maximum width L1', the second portion 124 has a second maximum width L2', and the second maximum width L2' is less than the first maximum width L1'. The connected reflective retaining walls 120 may form a common electrode on the second-type semiconductor layer 116 side of the light-emitting device 110, which can reduce the IR-drop of the display apparatus 10 and improve the brightness uniformity within the display apparatus 10*a*. The connected reflective retaining walls 120 serving as the common electrode may be controlled together, and the electrode 130 of each light-emitting device structure 100 may be individually controlled. In some embodiments, the color conversion material 140 may convert red color light, green color light, or blue color light.

Figure 8:
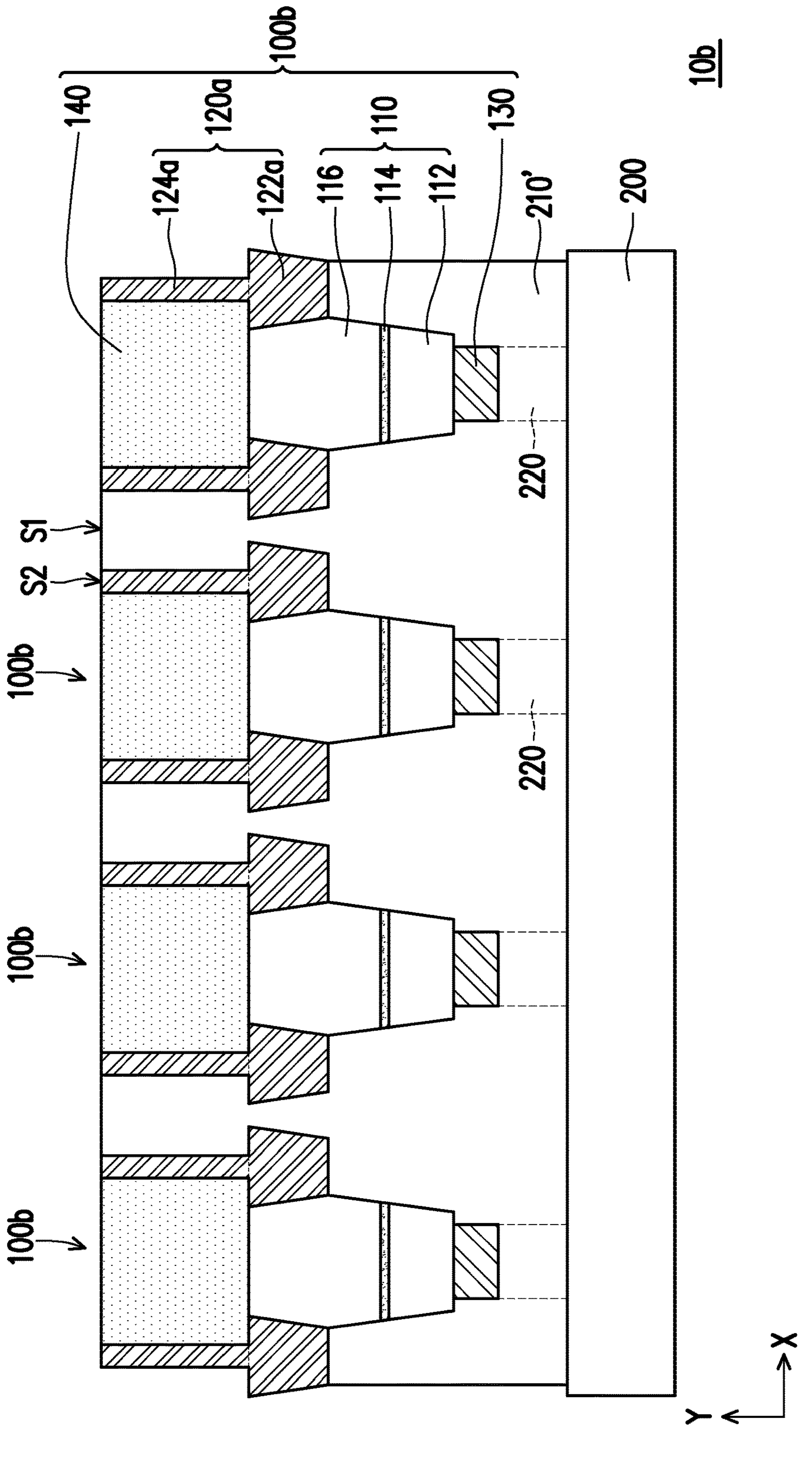
FIG. 8 is a schematic cross-sectional view of a display apparatus according to another embodiment of the disclosure.

FIG. 8 is a schematic cross-sectional view of a display apparatus according to another embodiment of the disclosure. Please refer to FIG. 7A and FIG. 8 at the same time. A display apparatus 10*b* of the embodiment is similar to the display apparatus 10*a*. The difference between the two is that in the embodiment, an insulating layer 210' disposed on the substrate 200 covers a part of the light-emitting devices 110, is located between the first portion 122*a* of the reflective retaining wall 120*a* and the substrate 200, and further extends between the reflective retaining walls 120*a* of the two adjacent light-emitting device structures 100*b*, wherein a first outer surface S1 of the insulating layer 210' is flush with a second outer surface S2 of the second portion 124*a*. In other words, each light-emitting device structure 100*b* in the display apparatus 10*b* of the embodiment may be individually controlled by an electrical signal through the electrode 130 and the reflective retaining wall 120*a* with a metal material.

It is worth mentioning that the display apparatuses 10*a* and 10*b* may select the appropriate light-emitting device structures 100, 100*a*, 100*b*, 100*c*, 100*d*, 100*e*, and 100*f* according to usage requirements, and the color conversion material 140 may also be selectively filled within the accommodating space C in the light-emitting device structures 100*b*, 100*c*, 100*d*, 100*e*, and 100*f* according to usage requirements to provide the effect of color conversion of the display apparatuses 10*a* and 10*b*.

In summary, in the design of the light-emitting device structure of the disclosure, the first portion of the reflective retaining wall surrounds the side wall of the second-type semiconductor layer of each light-emitting device and exposes the light-emitting surface of each light-emitting device, the second portion of the reflective retaining wall is disposed on the surface of the first portion, and the connection portion between the second portion and the first portion is separated from the light-emitting surface by the distance. In this way, the configuration of the reflective retaining wall does not block the light-emitting surface of the light-emitting device, which can reduce the light shielding of the metal groove in the prior art and effectively improve the light extraction efficiency of the light-emitting device structure of the disclosure. In addition, the display apparatus adopting the light-emitting device structure of the disclosure can have preferable display quality.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A light-emitting device structure, comprising:

at least one light-emitting device, each of the at least one light-emitting device comprising a first-type semiconductor layer, a light-emitting layer, and a second-type semiconductor layer, wherein the light-emitting layer is located between the first-type semiconductor layer and the second-type semiconductor layer, and the second-type semiconductor layer has a light-emitting surface; and a reflective retaining wall, comprising a first portion and a second portion, wherein the first portion surrounds a side wall of the second-type semiconductor layer of each of the at least one light-emitting device and exposes the light-emitting surface of each of the at least one light-emitting device, the second portion is disposed on a surface of the first portion away from the light-emitting layer, and a connection portion between the second portion and the first portion is separated from the light-emitting surface by a distance, wherein in a cross-sectional view, the second portion of the reflective retaining wall comprises two side walls having a minimum width therebetween, and the light-emitting surface has a maximum width, wherein the minimum width between the two side walls is greater than the maximum width of the light-emitting surface.

2. The light-emitting device structure according to claim 1, wherein the first portion of the reflective retaining wall is electrically connected to the second-type semiconductor layer.

3. The light-emitting device structure according to claim 1, wherein the second portion and the surface of the first portion of the reflective retaining wall and the light-emitting surface of each of the at least one light-emitting device define an accommodating space, and a first orthographic projection area of the accommodating space on a horizontal plane is greater than a second orthographic projection area of the light-emitting surface on the horizontal plane.

4. The light-emitting device structure according to claim 3, further comprising:

a color conversion material, disposed within the accommodating space.

5. The light-emitting device structure according to claim 1, wherein the at least one light-emitting device is a plurality of light-emitting devices, the first portion between adjacent two of the light-emitting devices has a first maximum width, the second portion has a second maximum width, and the second maximum width is less than the first maximum width.

6. The light-emitting device structure according to claim 5, wherein the second portion has a height, and a ratio of the height to the first maximum width is between 1 and 4.

7. The light-emitting device structure according to claim 1, wherein a material of the first portion and a material of the second portion are different metal materials.

8. The light-emitting device structure according to claim 7, wherein a conductivity of the first portion is greater than a conductivity of the second portion.

9. The light-emitting device structure according to claim 7, wherein a reflectivity of the second portion is greater than a reflectivity of the first portion.

10. The light-emitting device structure according to claim 1, further comprising:

a reflective layer, covering a surrounding surface of the second portion, wherein a reflectivity of the reflective layer is greater than a reflectivity of the reflective retaining wall.

11. The light-emitting device structure according to claim 1, further comprising:

an ohmic contact layer, disposed between the first portion and the second-type semiconductor layer.

12. The light-emitting device structure according to claim 1, wherein the surface of the first portion is flush with the light-emitting surface.

13. A display apparatus, comprising:

a substrate; and a plurality of light-emitting device structures, disposed on the substrate, each of the light-emitting device structures comprising:

at least one light-emitting device, each of the at least one light-emitting device comprising a first-type semiconductor layer, a light-emitting layer, and a second-type semiconductor layer, wherein the light-emitting layer is located between the first-type semiconductor layer and the second-type semiconductor layer, and the second-type semiconductor layer has a light-emitting surface; and a reflective retaining wall, comprising a first portion and a second portion, wherein the first portion surrounds a side wall of the second-type semiconductor layer of each of the at least one light-emitting device and exposes the light-emitting surface of each of the at least one light-emitting device, the second portion is disposed on a surface of the first portion away from the light-emitting layer, and a connection portion between the second portion and the first portion is separated from the light-emitting surface by a distance, wherein in a cross-sectional view, the second portion of the reflective retaining wall comprises two side walls having a minimum width therebetween, and the light-emitting surface has a maximum width, wherein the minimum width between the two side walls is greater than the maximum width of the light-emitting surface.

14. A display apparatus according to claim 13, further comprising:

an insulating layer, disposed on the substrate, covering a part of the light-emitting device structures, and located between the first portion of the reflective retaining wall and the substrate, wherein the insulating layer further extends between the reflective retaining walls of adjacent two of the light-emitting device structures, and a first outer surface of the insulating layer is flush with a second outer surface of the second portion.

15. The display apparatus according to claim 13, wherein a material of the reflective retaining wall is metal, and adjacent two of the light-emitting device structures share the same reflective retaining wall.

* * * * *